United States Patent
Moon

(10) Patent No.: US 8,900,930 B2
(45) Date of Patent: Dec. 2, 2014

(54) METHOD TO MAKE RF-PCM SWITCHES AND CIRCUITS WITH PHASE-CHANGE MATERIALS

(71) Applicant: HRL Laboratories, LLC, Malibu, CA (US)

(72) Inventor: Jeung-Sun Moon, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 17 days.

(21) Appl. No.: 13/737,441

(22) Filed: Jan. 9, 2013

(65) Prior Publication Data

US 2014/0191181 A1    Jul. 10, 2014

(51) Int. Cl.
| | |
|---|---|
| H01L 21/00 | (2006.01) |
| H01L 47/00 | (2006.01) |
| H01L 27/24 | (2006.01) |
| H01L 45/00 | (2006.01) |

(52) U.S. Cl.
CPC ............ *H01L 27/2409* (2013.01); *H01L 45/16* (2013.01)
USPC .............................................. 438/125; 257/4

(58) Field of Classification Search
None
See application file for complete search history.

(56) References Cited

U.S. PATENT DOCUMENTS

2008/0029753 A1* 2/2008 Xu et al. ........................... 257/4

OTHER PUBLICATIONS

Chua et al., "Low resistance, high dynamic range reconfigurable phase change switch for RF applications", Applied Physics Letters vol. 97, 183506, (2010).
Lo et al., "Three-terminal probe reconfigurable phase-change material switches", IEEE Transactions on Electron Devices., vol. 57, p. 312, (2010).
Wen et al., "A phase-change via-reconfigurable on-chip inductor", IEDM Tech digest, (2010).
EE Times, Nov. 2011, "Samsung preps 8-Gbit phase-change memory".
Perniola et al, "Electrical behavior of phase change memory cells based on GeTe", IEEE EDL., vol. 31, p. 488 (2010).

* cited by examiner

*Primary Examiner* — Whitney T Moore
*Assistant Examiner* — Joseph Galvin, III
(74) *Attorney, Agent, or Firm* — Ladas & Parry

(57) ABSTRACT

A radio frequency switch includes a first transmission line, a second transmission line, a first electrode electrically coupled to the first transmission line, a second electrode electrically coupled to the second transmission line, and a phase change material, the first transmission line coupled to a first area of the phase change material and the second transmission line coupled to a second area of the phase change material. When a direct current is sent from the first electrode to the second electrode through the phase change material, the phase change material changes state from a high resistance state to a low resistance state allowing transmission from the first transmission line to the second transmission line. The radio frequency switch is integrated on a substrate.

14 Claims, 9 Drawing Sheets

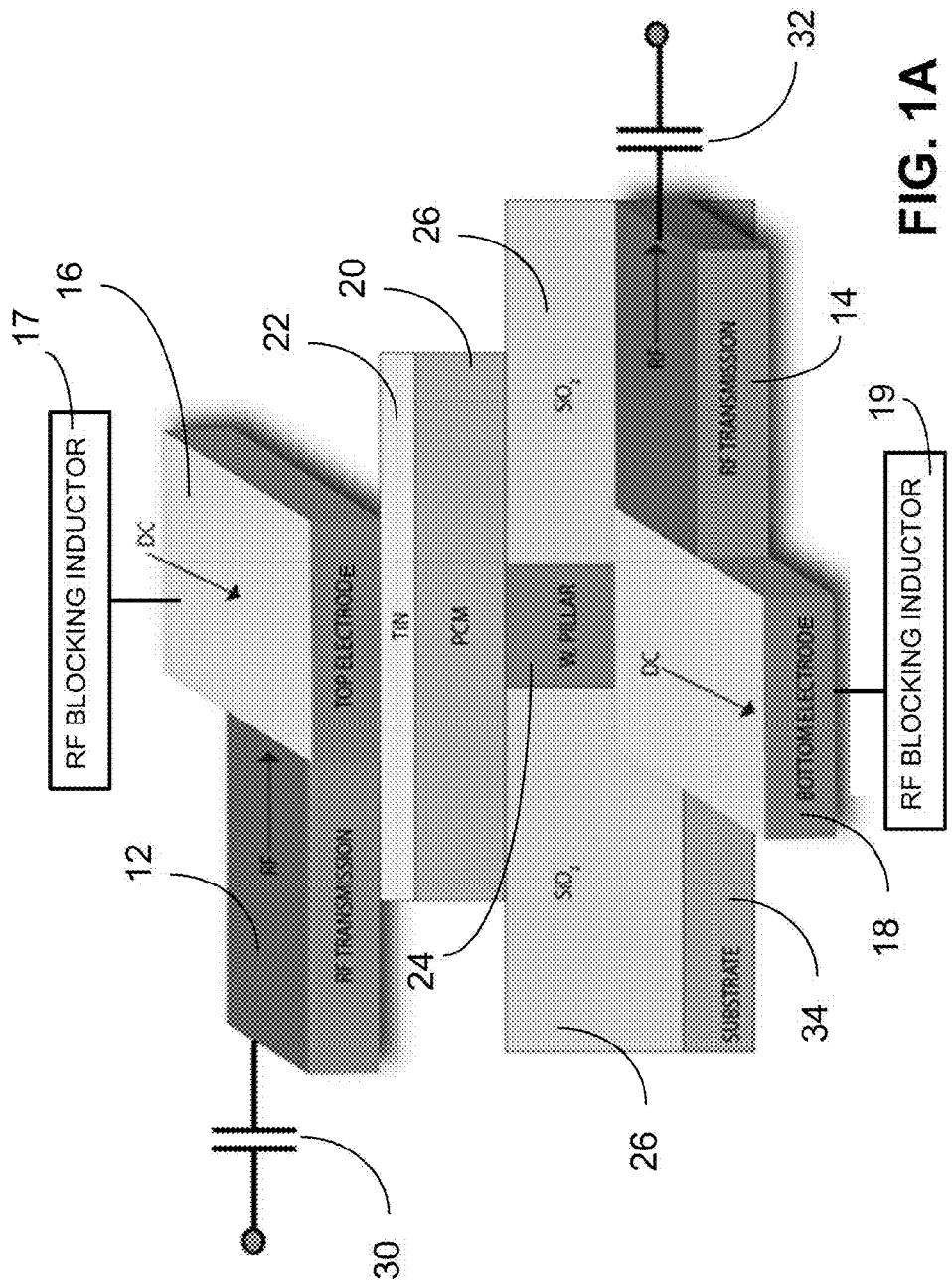

METHOD TO MAKE RF-PCM SWITCHES AND CIRCUITS WITH PHASE-CHANGE MATERIALS

CROSS REFERENCE TO RELATED APPLICATIONS

None

TECHNICAL FIELD

This disclosure relates to radio frequency (RF) switches, and in particular to RF-PCM switches using phase change material (PCM).

BACKGROUND

RF switches are key elements used in RF systems including communications and radars. RF switches enable low-loss, low-noise, fast, linear signal routing. They may also be used for impedance tuning and phase shifting. Due to varying system RF power handling requirements, it is important that an RF switch have linear performance from approximately a milli-watt (mW) to a watt level. While micro-electromechanical (MEMS) switches have been demonstrated in the prior art for RF systems with the desired low-loss, low-noise, isolation, linearity, and adequate power handling properties, these prior art RF switches have high switching voltage (30-70 V) requirements, low reliability and packaging issues. Thus, even after the decades of research, RF-MEMS switches are not commonly found in RF systems.

Monolithic microwave integrated circuit (MMIC) integration has in general been limited due to the size and high voltage requirements of prior art RF-MEMS switches, and mobile platform applications are very difficult to realize due to the high switching voltage requirements.

In the prior art Chua et al., "Low resistance, high dynamic range reconfigurable phase change switch for RF applications", Applied Physics Letters vol. 97, 183506, (2010) mentions using PCM material for RF switches; however, Chua does not describe an RF switch design using PCM materials. Lo et al., "Three-terminal probe reconfigurable phase-change material switches", IEEE Transactions on Electron Devices., vol. 57, p. 312, (2010) describes a switch with a three-terminal layout, consisting of an array of sub-vias; however, in Lo the switching is performed using external probes. Wen et al., "A phase-change via-reconfigurable on-chip inductor", IEDM Tech digest, (2010) describes via structures with GeTe material, with an $R_{on}$ of 1.1 ohm and an Ron/Roff of $3 \times 10^4$; however, in Wen the switching is also performed using external probes.

The principal of PCM has been known since the 1960s. Rewritable optical DVDs have been developed using Ge2Sb2Te5, and also using (Ag or In)Sb2Te. Lately, phase change materials have been being developed for non-volatile memory, as a future replacement of flash memory. Companies involved in these developments include Micron, Samsung, IBM, STMicroelectronics, and Intel. Following are recent publications on use of PCMs for digital applications: EE Times, November, 2011, "Samsung preps 8-Gbit phase-change memory", Perniola et al", "Electrical behavior of phase change memory cells based on GeTe", IEEE EDL., vol. 31, p. 488, (2010).

What is needed are RF switches using phase-change materials that are compatible with conventional semiconductor RF integrated circuit (RFIC) and MMIC processes. The embodiments of the present disclosure answer these and other needs.

SUMMARY

In a first embodiment disclosed herein, a radio frequency switch comprises a first transmission line, a second transmission line, a first electrode electrically coupled to the first transmission line, a second electrode electrically coupled to the second transmission line, and a phase change material, the first transmission line coupled to a first area of the phase change material and the second transmission line coupled to a second area of the phase change material, wherein when a direct current is sent from the first electrode to the second electrode through the phase change material, the phase change material changes state from a high resistance state to a low resistance state allowing transmission from the first transmission line to the second transmission line, and wherein the radio frequency switch is integrated on a substrate.

In another embodiment disclosed herein, a radio frequency switch comprises a first transmission line, a second transmission line, a first electrode, a second electrode, and a phase change material, the first transmission line coupled to a first area of the phase change material, the second transmission line coupled to a second area of the phase change material, the first electrode coupled to a third area of the phase change material, and the second electrode coupled to a fourth area of the phase change material, wherein when a direct current is sent from the first electrode to the second electrode through the phase change material, the phase change material changes state from a high resistance state to a low resistance state allowing transmission from the first transmission line to the second transmission line, and wherein the radio frequency switch is integrated on a substrate.

In yet another embodiment disclosed herein, a method of making a radio frequency switch comprises forming an insulator on a substrate, forming a first transmission line on the insulator and coupled to a first area of a phase change material, forming a second transmission line on the insulator and coupled to a second area of the phase change material, forming a first conductor connected to a third area of the phase change material, forming a first electrode connected to the first conductor, forming a second conductor connected to a fourth area of the phase change material, and forming a second electrode connected to the second conductor.

In still another embodiment disclosed herein, a reconfigurable circuit comprises a first circuit comprising at least a first radio frequency switch integrated with circuitry comprising GaN based transistors or III-IV bipolar transistors, the first radio frequency switch comprising a first transmission line, a second transmission line, a first electrode, a second electrode, and a phase change material, wherein the first transmission line coupled to a first area of the phase change material, the second transmission line coupled to a second area of the phase change material, the first electrode coupled to a third area of the phase change material, and the second electrode coupled to a fourth area of the phase change material, and wherein when a direct current is sent from the first electrode to the second electrode through the phase change material, the phase change material changes state from a high resistance state to a low resistance state allowing transmission from the first transmission line to the second transmission line.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 1A shows a four-terminal RF-PCM switch with a vertical arrangement of RF transmission lines in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1B:
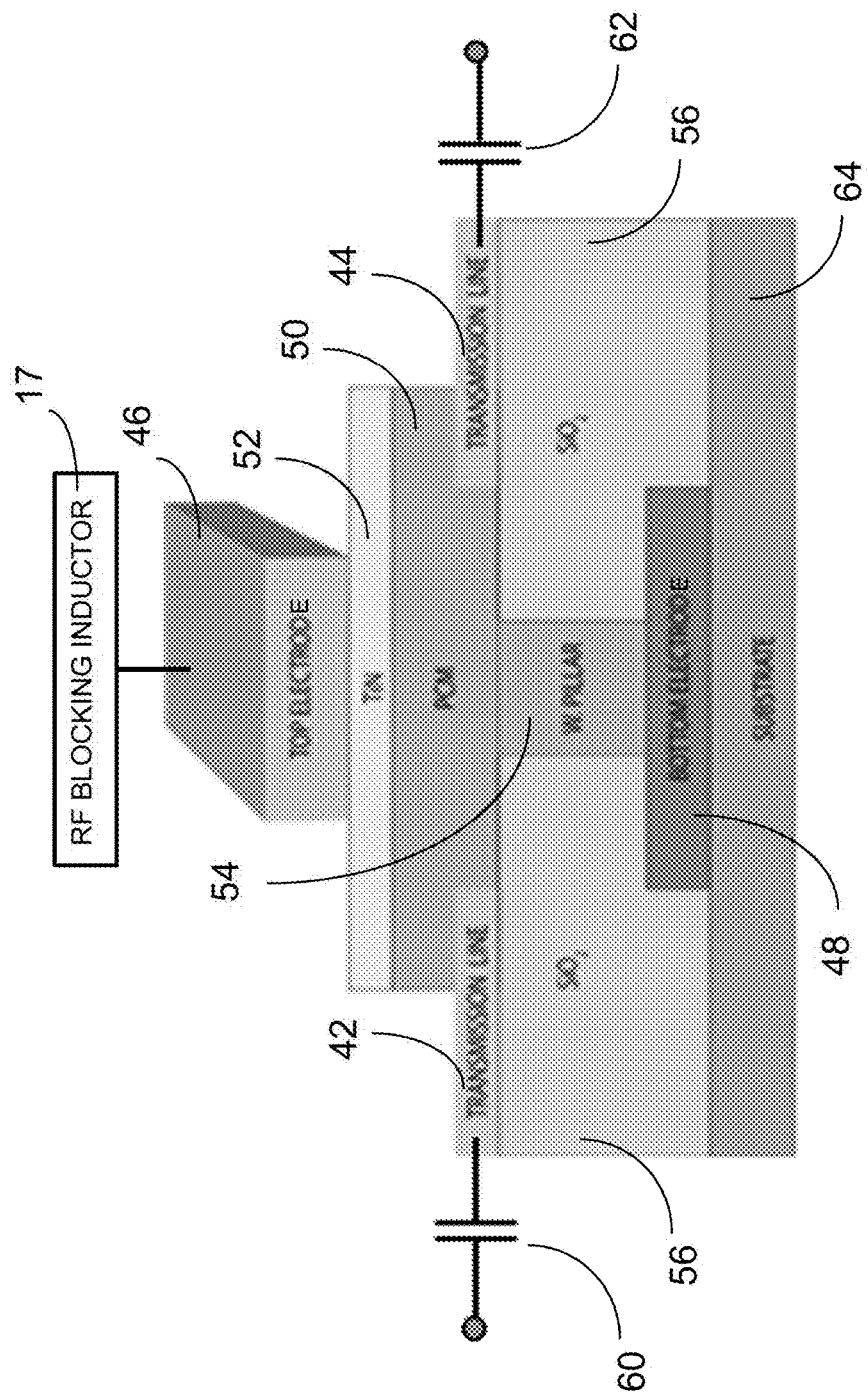
FIG. 1B shows a four-terminal RF-PCM switch with a parallel arrangement of RF transmission lines in accordance with the present disclosure.

In the following RF switches with phase change materials are referred to as RF-PCM switches. Referring now to FIGS. 1A and 1B, two different four-terminal RF-PCM switches are shown. The RF-PCM switch shown in FIG. 1A is designed with a vertical geometry between the RF transmission lines. The RF-PCM switch shown in FIG. 1B is designed with a parallel geometry between the RF transmission lines.

The RF-PCM switch shown in FIG. 1A has a first RF transmission line 12, which is electrically connected to a first conductor 22. The first conductor 22 is also electrically connected to a top electrode 16, which functions as a switch control, and is electrically connected to the PCM 20. The PCM is formed on an insulator 26. A second conductor 24 is connected to the PCM 20, and separated from the first conductor 22 by the PCM 20. The second conductor 24 is electrically connected to a bottom electrode 18, which along with the top electrode 16 functions as the switch control. The second conductor 24 is also electrically connected to a second RF transmission line 14. The RF-PCM switch may be built on a substrate 34. The RF transmission lines may be also used to transmit signals other than RF signals.

To switch the RF-PCM switch of FIG. 1A, a current pulse may be applied from the top 16 electrode to the bottom 18 electrode, thereby passing through the PCM 20. The current pulse may have a pulse width of less than a microsecond. The current pulse changes the PCM 20 from an amorphous high resistance material to a crystalline low resistance state. When in a crystalline low resistance state, the PCM 20 allows an RF signal to be transmitted from the first RF transmission line 12 to conductor 22, then through the PCM 20 and through the conductor 24 to the second RF transmission line 14.

To prevent the RF signals from transmitting through the top electrode 16 or the bottom electrode 18, the top electrode 16 is connected to RF blocking inductor 17, and the bottom electrode 18 is connected to RF blocking inductor 19 to block RF signals. Also, because the first RF transmission line 12 and the top electrode 16 are electrically connected, to block any direct current (DC) on the top electrode 16 from transmission on the first RF transmission line 12, the first RF transmission line 12 is connected to DC blocking capacitor 30. Similarly, because the second RF transmission line 14 and the bottom electrode 18 are electrically connected, to block any DC on the bottom electrode 18 from transmission on the second RF transmission line 14, the second RF transmission line 14 is connected to DC blocking capacitor 32.

The RF-PCM switch may be fabricated on a substrate 34, which may be silicon (Si), silicon germanium (SiGe), silicon carbide (SiC), sapphire, pyrex, gallium arsenide (GaAs), or III-V compounds such as GaN, InAs, InSb, and InP. The first and second RF transmission lines 12 and 14, and the top and bottom electrodes 16 and 18 may be formed from any metal such as aluminum (Al), cooper (Cu), or gold (Au). The insulator 26 is preferably a low-k dielectric insulator, such as silicon dioxide ($SiO_2$), silicon nitride ($Si_3N_4$), or benzo-cyclo-butene (BCB), to reduce any parasitic capacitive coupling between the first and second RF transmission lines 12 and 14. Other appropriate materials for insulator 26 are polyimide, and polymethylglutarimide (PMGI). The first and second conductors 22 and 24 can be titanium nitride (TiN), tungsten (W) or any other metal that doesn't deform at high temperature and that doesn't form an alloy with the phase-change material (PCM).

The RF-PCM switch shown in FIG. 1B is similar to the RF-PCM switch of FIG. 1A; however, the RF-PCM switch shown in FIG. 1A is designed with a vertical geometry between the RF transmission lines, while the RF-PCM switch shown in FIG. 1B is designed with a parallel geometry between the RF transmission lines.

The RF-PCM switch of FIG. 1B has a first RF transmission line 42, which is electrically connected to PCM 50. A second RF transmission line 44 is electrically connected to PCM 50, but is not electrically connected to the first RF transmission line 42. A top electrode 46 is connected to conductor 52, and the conductor 52 is connected to the PCM 50. The PCM 50 is also electrically connected to conductor 54 to electrically connect the PCM 50 to the bottom electrode 48. The RF transmission lines 42 and 44 and the PCM 50 may be formed on insulator 56, which along with bottom electrode 48 may be formed on substrate 64.

To switch the RF-PCM switch of FIG. 1B, a current pulse may be sent from the top electrode 46 to the bottom electrode 48 electrode thereby passing through the PCM 50. The current pulse may have a pulse width of less than a microsecond. The current pulse changes the PCM 50 from an amorphous high resistance material to a crystalline low resistance state. When in a crystalline low resistance state, the PCM 50 allows an RF signal to be transmitted from the first RF transmission line 42 to the second RF transmission line 44.

To prevent the RF signals from transmitting via the top electrode 46 or the bottom electrode 48, the top electrode 46 is connected to an RF blocking inductor 17. The bottom electrode 48 is also connected to an RF blocking inductor similar, such as RF-blocking inductor 19 shown in FIG. 1A to block RF signals. To block any DC on the top electrode 46 from being transmitted on the first RF transmission line 42, the first RF transmission line 42 is connected to DC blocking capacitor 60. Similarly, to block any DC on the bottom electrode 48 from being transmitted on the second RF transmission line 44, the second RF transmission line 44 is connected to DC blocking capacitor 62.

The RF-PCM switch may be fabricated on a substrate 64, which may be silicon (Si), silicon germanium (SiGe), silicon carbide (SiC), sapphire, pyrex, gallium arsenide (GaAs), or III-V compounds such as GaN, InAs, InSb, and InP. The first and second RF transmission lines 42 and 44, and the top and bottom electrodes 46 and 48 may be formed from any metal such as aluminum (Al), cooper (Cu), or gold (Au). The insulator 56 is preferably a low-k dielectric insulator, such as silicon dioxide ($SiO_2$), silicon nitride ($Si_3N_4$), or benzo-cyclo-butene (BCB), to reduce any parasitic capacitive coupling between the first and second RF transmission lines 42 and 44. Other appropriate materials for insulator 56 are polyimide, and polymethylglutarimide (PMGI). The first and second conductors 52 and 54 can be titanium nitride (TiN), tungsten (W) or any other metal that doesn't deform at high temperature and that doesn't form an alloy with the phase-change material (PCM).

The phase-change materials (PCMs) 20 and 50 may be $Ge_xTe_{1-x}$, $Ge_xSb_yTe_z$, or their derivatives. Measurements of sheet resistance of $Ge_{0.16}Sb_{0.24}Te_{0.6}$ and $Ge_{0.4}Te_{0.6}$ PCM materials have shown a phase change from an amorphous high resistance state to a crystalline low resistance state with a 106:1 resistance ratio between the high resistance and the low resistance.

The sheet resistance of the crystalline state of PCM may be 100 $\Omega$/sq for 100 nm thick GeTe and 82 $\Omega$/sq for 200 nm thick GeSbTe. Important for switch applications, it has been shown that GeSbTe digital-PCM cells fabricated with a 190 nm diameter can successfully have 10 million read/write cycles, and be switched with a current pulse 0.5 mA.

A RF-PCM switch with PCM cells of approximately 40 $\mu m^2$ may be designed to deliver a resistance in the R-SET state of approximately 1$\Omega$. GeTe-based digital PCM cells with PCM cells having approximately a 0.3 $\mu$m diameter may have a resistance in the R-SET state of 20$\Omega$. In this configuration the ratio of the resistance in the R-RESET state to the resistance in the R-SET state is approximately 105, which allows RF-PCM switches to be designed with a low on resistance (Ron), a high off resistance (Roff), and a high Ron/Roff ratio.

For example, a RF-PCM switch with 2 $\mu m^2$ PCM switch may have a resistance in the R-SET state of <1$\Omega$ and a RESET/SET resistance ratio of 105:1.

The maximum needed voltage and current for switching the PCM from R-SET to R-RESET may be 3 volts and ~500 mA, respectively.

Figure 2A:
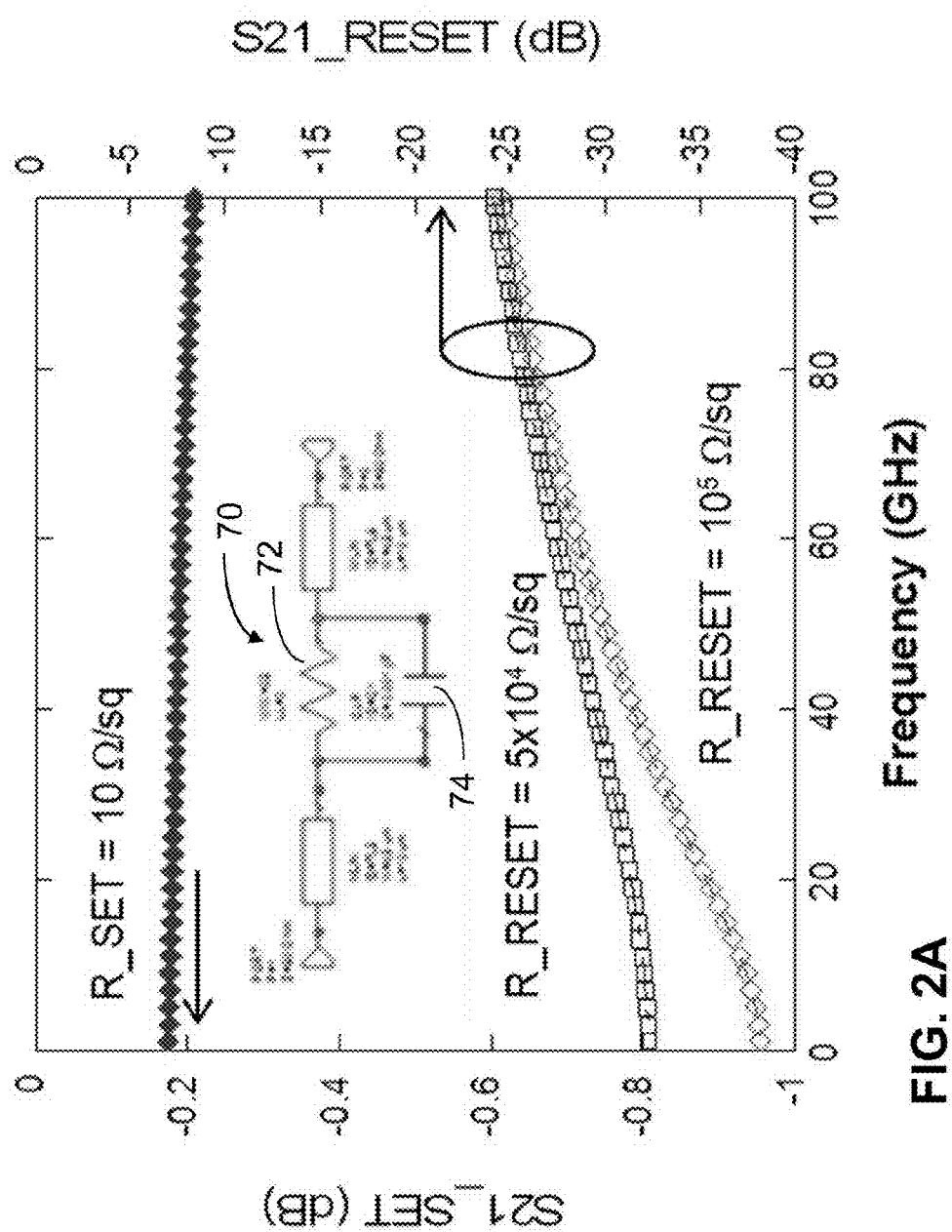
FIG. 2A shows an equivalent circuit model for a RF-PCM switch and simulation results for R-SET, when the PCM is at a low resistance, and for R-RESET, when the PCM is at a high resistance, in accordance with the present disclosure.

FIG. 2A shows a schematic of an equivalent circuit 70 for an RF-PCM switch and its simulated RF insertion loss at the SET state and RF isolation at the RESET state. An RF-PCM switch may be simulated with a resistor 72 and a capacitor 74 to model parasitic capacitance.

The RF insertion loss and isolation was simulated for an RF-PCM switch with a R-SET resistance of 10 $\Omega$/sq and a contact resistance of 15 $\Omega \cdot \mu$m between the conductors 22, 24, or 52, 54 and the PCM 20 or 50. An RF insertion loss S21 SET of 0.1-0.2 dB and an RF isolation S21 RESET of 25 dB or better can be achieved up to 100 GHz. The RF isolation result is mainly due to the parasitic capacitive coupling though the substrate. The RF insertion loss and isolation may also be traded off, one for the other, in RF-PCM switch designs. FIG. 2A shows the R-RESET for a PCM configuration with $5 \times 10^4$ $\Omega$/sq and for a PCM configuration with $10^5$ $\Omega$/sq.

Figure 2B:
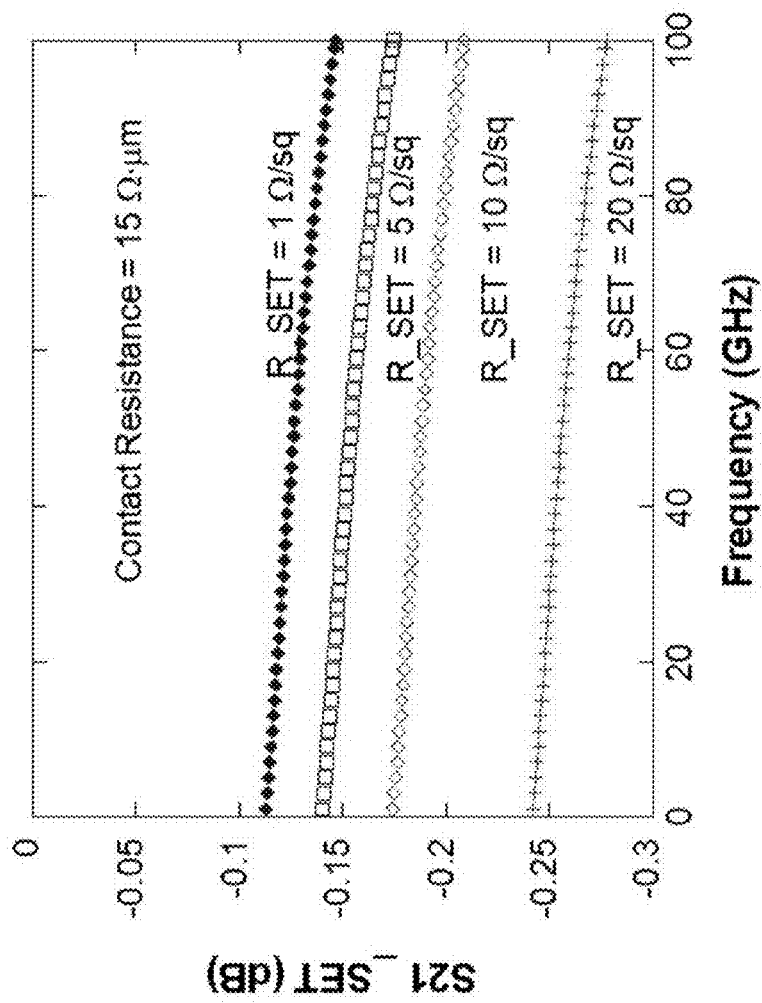
FIG. 2B shows the simulated R-SET of an RF-PCM switch for different PCM configurations in accordance with the present disclosure.

FIG. 2B shows the simulated RF S21_SET insertion loss of an RF-PCM switch for different configurations of the PCM and a contact resistance of 15 $\Omega \cdot \mu$m. The contact resistance is the resistance between a conductor, such as conductor 22, 24, 52, or 54, and the PCM. The PCM configurations shown in FIG. 2B include curves for R-SET equal to 1 $\Omega$/sq, 5 $\Omega$/sq, 10 $\Omega$/sq, and 20 $\Omega$/sq from 0 to 100 GHz.

RF-PCM switches can be integrated with conventional semiconductor RFIC and MMIC processes, enabling reconfigurable RFICs and MMICs. The semiconductor materials used for the substrate 34 and 64 for integration into RFICs and MMICs may include Si, SiGe, and III-V compounds such as GaN, InAs, InSb, and InP. The device technologies that may be integrated include FETs and bipolar transistors. The RF-PCM switches may also be integrated with resistors (R), inductors (L), and capacitors (C). Integrating the RF-PCM switches with other circuit elements allows the circuits of passive elements, such as L, R, C elements, and active circuits, such as FETs or bipolar transistors or other such elements, to be reconfigurable.

Figure 3A:
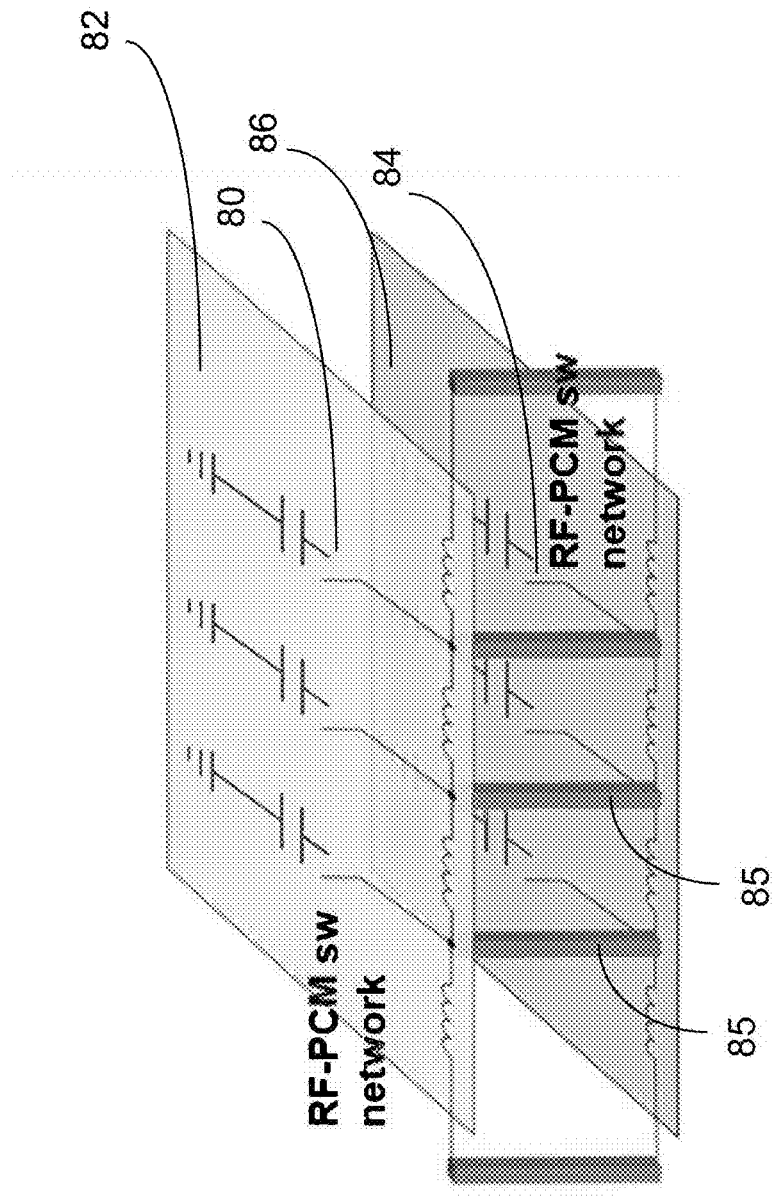
FIG. 3A shows a three dimensional (3D) arrangement of RF-PCM switches integrated with inductors (Ls) and capacitors (Cs) in accordance with the present disclosure.
Figure 3B:
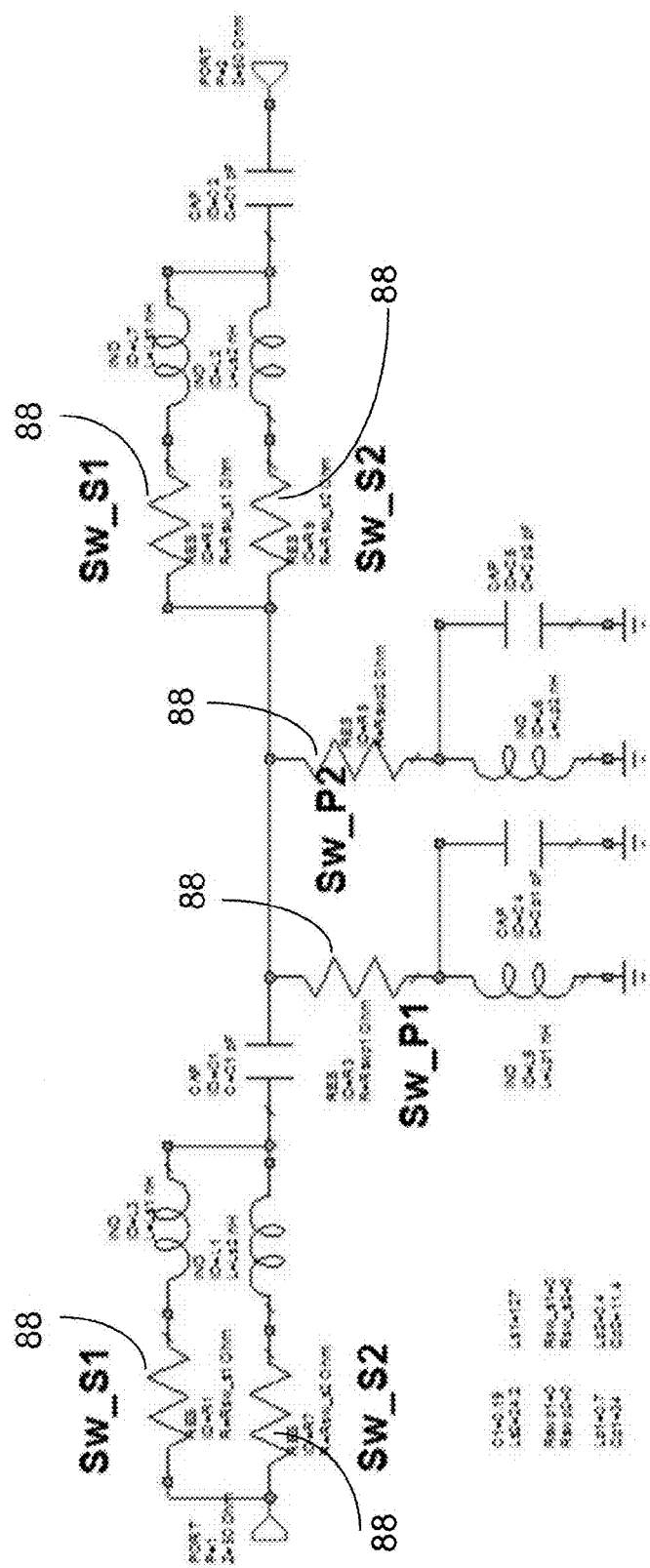
FIG. 3B shows a reconfigurable filter with six RF-PCM switches in accordance with the present disclosure.
Figures 3C, 3D:
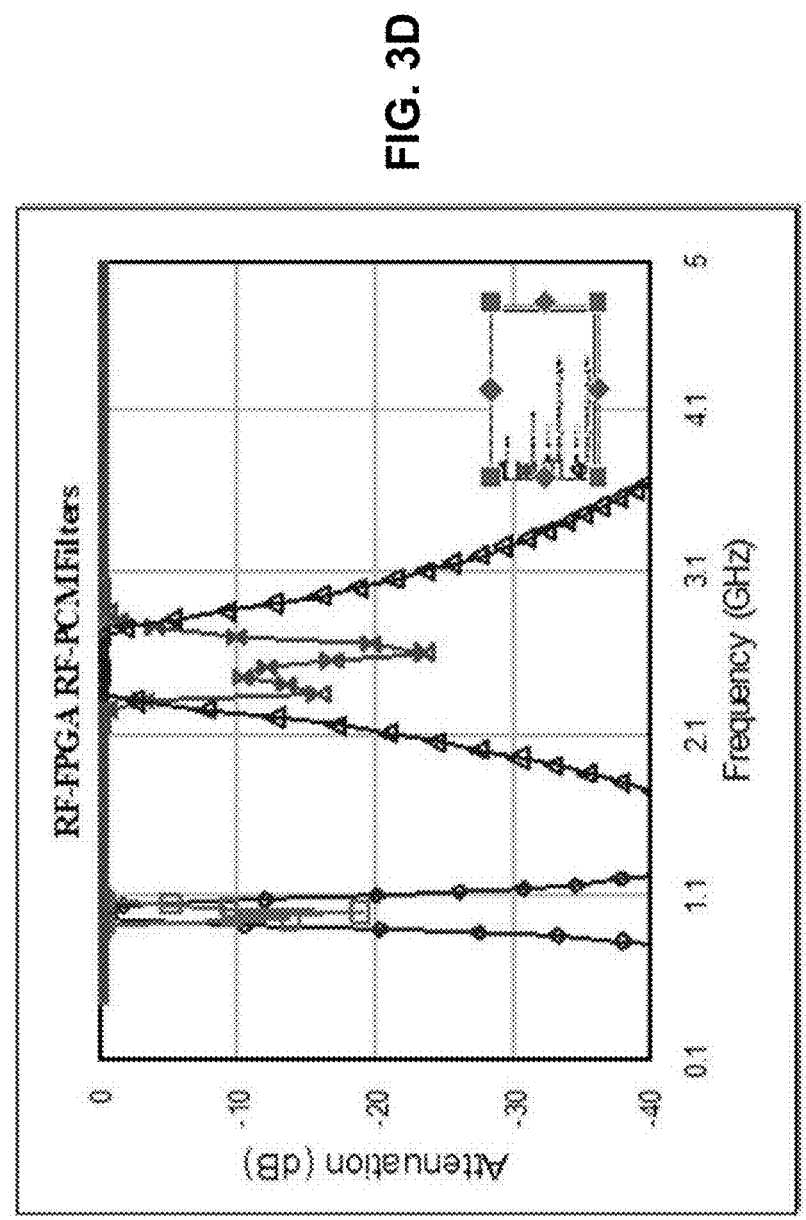
FIG. 3D shows a filter transfer function of the reconfigurable filter of FIG. 3B having pass band center frequencies of 1 GHz and 2.4 GHz, respectively, depending on the RF-PCM switch settings as shown in FIG. 3C, in accordance with the present disclosure.

For example, FIGS. 3A and 3B show filter schematics with LC lumped elements and RF-PCM switches integrated together. The reconfigurable filter shown in FIG. 3C may have its passband reconfigured to be 1 GHz or 2.4 GHz, as shown in FIG. 3D, depending on the R-SET and the R-RESET status, as shown in FIG. 3C, of the RF-PCM switches 88.

Another aspect of the use of RF-PCM switches is shown in FIG. 3A. The ability to integrate RF-PCM switches with other circuit elements in a RFIC or MMIC allows very compact structures and even three dimensional (3D) circuitry. As shown in FIG. 3A, RF-PCM switches 80 and other circuitry, such as capacitors, inductors, resistors, and transistors may be integrated on one circuit plane 82. The circuit plane 80 may be a substrate, a RFIC, a MMIC, or a circuit board with the integrated RF-PCM switches 80 and other circuitry. Other RF-PCM switches 84 and other circuitry, such as capacitors, inductors, resistors, and transistors may be integrated on another circuit plane 86, which also may be a substrate, a RFIC, a MMIC, or a circuit board. The RF-PCM switches allow the circuitry to be reconfigurable. By stacking circuit planes on one another and connecting the circuitry on circuit plane 82 to the circuitry on circuit plane 86 with conductors 85 between the circuit planes, a very compact three dimensional reconfigurable circuit may be realized, as shown in FIG. 3A. The conductors 85 between the circuit planes 82 and 86 may be metal vias.

Figure 4A:
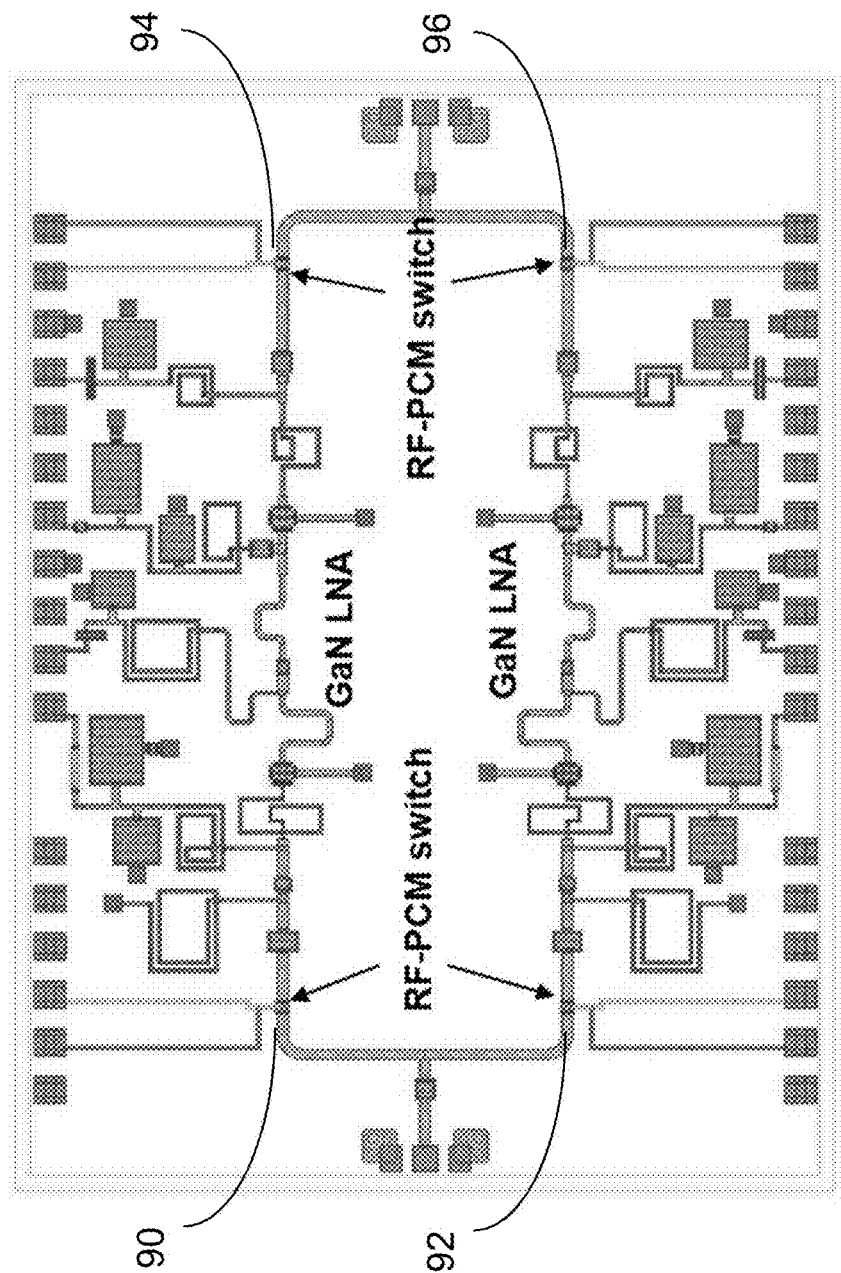
FIG. 4A shows an example MMIC layout consisting of RF-PCM switches and GaN LNAs in accordance with the present disclosure.

FIG. 4A shows a reconfigurable low-noise amplifier consisting of RF-PCM switches 90, 92, 94 and 96 and GaN field effect transistors (FETs) in a MMIC layout. The two GaN LNAs, shown in FIG. 4A may be configured to improve the third order intercept point (OIP3) to 51 dBm and the spurious signal performance to less than 98 dBc at a Pin of −10 dBm up to 18 GHz, which enables high dynamic range signal detection immune to jamming signals.

Figure 4B:
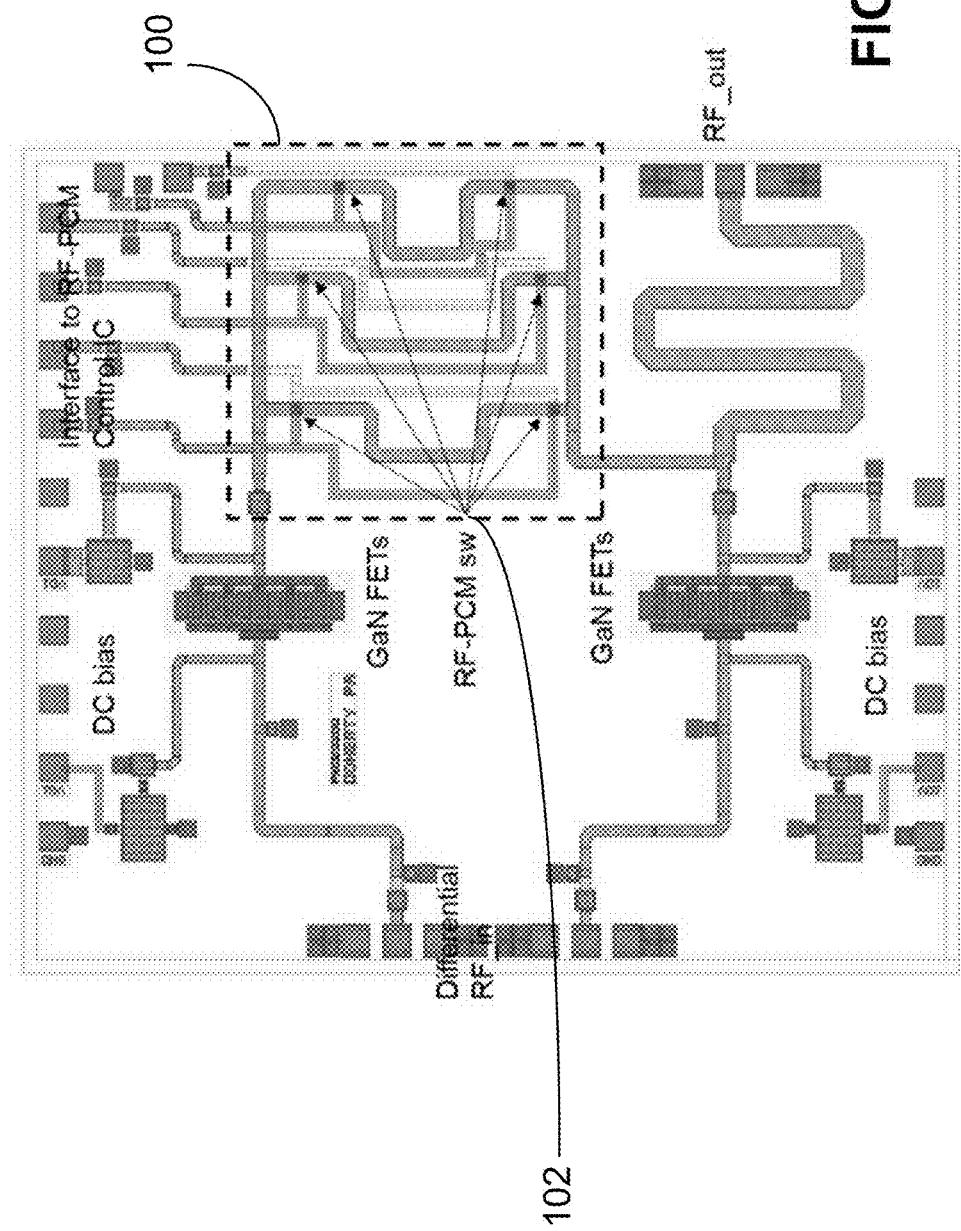
FIG. 4B shows an example layout of a GaN MMIC amplifier with a reconfigurable output matching network using RF-PCM switches in accordance with the present disclosure.

FIG. 4B shows an example layout of a GaN MMIC amplifier with a reconfigurable output matching network 100 using RF-PCM switches 102.

The fabrication process flow for an RF-PCM switch may be made to be similar to a tantalum nitride (TaN) MMIC resistor process with some modifications. The process for fabricating a RF-PCM switch is the following.
1. Lift-off metal-1 to form a bottom DC electrode and an RF transmission line,
2. Deposit a low-loss dielectric layer #1 such as SiO2,
3. Pattern an opening #1 in the dielectric layer around to be formed RF-PCM switches,
4. Lift-off an adhesion metal pillar (Tungsten (W) or TiW) on phase change material (PCM),
5. Deposit a low-loss dielectric layer #2 such as SiO2,
6. Pattern an opening #2 in the dielectric layer #2 to the PCM,
7. Lift-off an adhesion metal (TiN),
8. Lift-off metal-2 for the top DC electrode and RF transmission line.

In summary, the disclosed RF-PCM switches based on PCM materials such as $Ge_xTe_{1-x}$, $Ge_xSb_yTe_z$, or their derivatives enable reconfigurable RF functions in RFICs, MMICs, and passive devices such as single-pole-double-throw (SPDT) switches, phase shifters, and filters. The disclosed RF-PCM switches are binary (on or off). If necessary, the RF-PCM switches can be designed with multi-bit switches, especially for phase-shifter, phase-shift-key (PSK), and quadrature-amplitude-modulation (QAM) applications.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A radio frequency switch comprising:
a first transmission line;
a second transmission line;
a first electrode;
a second electrode;
a phase change material;
the first transmission line coupled to a first area of the phase change material, the second transmission line coupled to a second area of the phase change material, the first electrode coupled to a third area of the phase change material, and the second electrode coupled to a fourth area of the phase change material;
wherein when a direct current is sent from the first electrode to the second electrode through the phase change material, the phase change material changes state from a high resistance state to a low resistance state allowing transmission from the first transmission line to the second transmission line;
a first conductor connected to the third area of the phase change material and connected to the first electrode, the first conductor being between the phase change material and the first electrode; and
a second conductor connected to the fourth area of the phase change material and connected to the second electrode, the second conductor being between the phase change material and the second electrode;
wherein the first and second conductors comprise titanium nitride (TiN), tungsten (W), or any metal that does not form an alloy with the phase change material; and
wherein the radio frequency switch is integrated on a substrate.

2. The radio frequency switch of claim 1 further comprising:
wherein the second electrode is formed on the substrate; and
an insulator formed on the substrate and between the substrate and the first and second transmission lines to reduce parasitic capacitive coupling between the first and second transmission lines;
wherein the substrate comprises silicon (Si), silicon germanium (SiGe), silicon carbide (SiC), sapphire, pyrex, gallium arsenide (GaAs), GaN, InAs, InSb, InP or any other III-V material; and
wherein the insulator comprises silicon dioxide ($SiO_2$), silicon nitride ($Si_3N_4$), benzo-cyclo-butene (BCB), or any low-k dielectric insulator.

3. The radio frequency switch of claim 1 further comprising:
a first capacitor coupled in series to the first transmission line for preventing current and voltage on the first electrode from transmitting on the first transmission line; and
a second capacitor coupled in series to the second transmission line for preventing current and voltage on the second electrode from transmitting on the second transmission line.

4. The radio frequency switch of claim 1 further comprising:
a first inductor coupled in series to the first electrode for preventing a radio frequency signal on the first transmission line from transmitting on the first electrode; and
a second inductor coupled in series to the second electrode for preventing a radio frequency signal on the second transmission line from transmitting on the second electrode.

5. The radio frequency switch of claim 1 wherein:
the phase change material comprises $Ge_xTe_{1-x}$, $Ge_xSb_yTe_z$, or derivatives of $Ge_xTe_{1-x}$ or $Ge_xSb_yTe_z$.

6. The radio frequency switch of claim 1 wherein:
the first and second transmission lines are radio frequency transmission lines.

7. The radio frequency switch of claim 1 wherein the radio frequency switch is connected to external capacitors and inductors in a planar configuration or in a three dimensional configuration.

8. A method of making a radio frequency switch comprising:
   forming an insulator on a substrate;
   forming a first transmission line on the insulator and coupled to a first area of a phase change material;
   forming a second transmission line on the insulator and coupled to a second area of the phase change material;
   forming a first conductor connected to a third area of the phase change material;
   forming a first electrode connected to the first conductor;
   forming a second conductor connected to a fourth area of the phase change material; and
   forming a second electrode connected to the second conductor.

9. The method of claim 8 wherein:
   the substrate comprises silicon (Si), silicon germanium (SiGe), silicon carbide (SiC), sapphire, pyrex, gallium arsenide (GaAs), GaN, InAs, InSb, InP or any other III-V material;
   the insulator comprises silicon dioxide ($SiO_2$), silicon nitride ($Si_3N_4$), benzo-cyclo-butene (BCB), or any low-k dielectric insulator;
   the first and second conductors comprise titanium nitride (TiN), tungsten (W), or any metal that does not form an alloy with the phase change material; and
   the phase change material comprises $Ge_xTe_{1-x}$, $Ge_xSb_yTe_z$, or derivatives of $Ge_xTe_{1-x}$ or $Ge_xSb_yTe_z$.

10. The method of claim 8 wherein:
    the first and second transmission lines are radio frequency transmission lines.

11. A reconfigurable circuit comprising;
    a first circuit comprising at least a first radio frequency switch integrated with circuitry comprising GaN based transistors or III-IV bipolar transistors;
    the first radio frequency switch comprising:
       a first transmission line;
       a second transmission line;
       a first electrode;
       a second electrode; and
       a phase change material;
       the first transmission line coupled to a first area of the phase change material, the second transmission line coupled to a second area of the phase change material, the first electrode coupled to a third area of the phase change material, and the second electrode coupled to a fourth area of the phase change material; and
    wherein when a direct current is sent from the first electrode to the second electrode through the phase change material, the phase change material changes state from a high resistance state to a low resistance state allowing transmission from the first transmission line to the second transmission line;
    a first conductor connected to the third area of the phase change material and connected to the first electrode, the first conductor being between the phase change material and the first electrode; and
    a second conductor connected to the fourth area of the phase change material and connected to the second electrode, the second conductor being between the phase change material and the second electrode;
    wherein the first and second conductors comprise titanium nitride (TiN), tungsten (W), or any metal that does not form an alloy with the phase change material.

12. The reconfigurable circuit of claim 11 comprising;
    a second circuit comprising at least a second radio frequency switch integrated with circuitry comprising GaN based transistors or III-IV bipolar transistors;
    the second radio frequency switch comprising:
       a first transmission line;
       a second transmission line;
       a first electrode;
       a second electrode; and
       a phase change material;
       wherein the first transmission line coupled to a first area of the phase change material, the second transmission line coupled to a second area of the phase change material, the first electrode coupled to a third area of the phase change material, and the second electrode coupled to a fourth area of the phase change material;
       wherein when a direct current is sent from the first electrode to the second electrode through the phase change material, the phase change material changes state from a high resistance state to a low resistance state allowing transmission from the first transmission line to the second transmission line; and
    at least one conductor connected between the first circuit and the second circuit.

13. The reconfigurable circuit of claim 12 wherein the first circuit is stacked on top of the second circuit to form a three dimensional circuit.

14. The compact reconfigurable circuit of claim 12 wherein the conductors are metal vias.

* * * * *